(12) United States Patent
Abele et al.

(10) Patent No.: US 8,450,132 B2
(45) Date of Patent: May 28, 2013

(54) THERMALLY ACTIVATED MICROMIRROR AND FABRICATION METHOD

(75) Inventors: Nicolas Abele, Lausanne (CH); Faouzi Khechana, Denens (CH); Philippe Renaud, Preverenges (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 77 days.

(21) Appl. No.: 13/001,247

(22) PCT Filed: Jun. 24, 2008

(86) PCT No.: PCT/EP2008/058018
§ 371 (c)(1),
(2), (4) Date: May 26, 2011

(87) PCT Pub. No.: WO2009/155968
PCT Pub. Date: Dec. 30, 2009

(65) Prior Publication Data
US 2011/0217804 A1     Sep. 8, 2011

(51) Int. Cl.
*H01L 21/00* (2006.01)

(52) U.S. Cl.
USPC .......................................................... 438/54

(58) Field of Classification Search
USPC ......................................... 438/54, 50, 52, 53
See application file for complete search history.

(56) References Cited

U.S. PATENT DOCUMENTS

| | | | |
|---|---|---|---|
| 6,531,947 B1 | 3/2003 | Weaver et al. | |
| 6,727,181 B2 * | 4/2004 | Hara | 438/706 |
| 6,804,429 B2 * | 10/2004 | Yu et al. | 385/24 |
| 7,091,057 B2 * | 8/2006 | Gan et al. | 438/48 |
| 2002/0021860 A1 | 2/2002 | Ruan et al. | |
| 2004/0243063 A1 * | 12/2004 | Roy et al. | 604/173 |

OTHER PUBLICATIONS

Xie H et al; "Endoscopic optical coherence tomographic imaging with a CMOS-MEMS micromirror"; Sensors and Actuators A, Elsevier Sequoia S.A., Lausanne, CH, vol. 103, No. 1-2, Jan. 15, 2003, pp. 237-241.

(Continued)

*Primary Examiner* — Charles Garber
*Assistant Examiner* — Reema Patel
(74) *Attorney, Agent, or Firm* — Howard IP Law Group, P.C.

(57) ABSTRACT

A method for fabricating a micromirror in a wafer, including the steps of: depositing and etching layers forming two arms; etching the wafer such that in the back face only a thin portion of the wafer remains in the region of formation of the micromirror and the arms; performing an anisotropic etch, such that the thin portion remains only in the areas of the micromirror and the arms; and performing an isotropic etch to remove the thin portions under the arms, the etching step for forming the arms being performed following their shape and so as to form holes traversing the arms, the holes being positioned at edges of the region separating the micromirror and the wafer on both the side of the micromirror and the side of the portions of the wafer remaining after the anisotropic etching step. The invention also concerns the micromirror.

10 Claims, 8 Drawing Sheets

OTHER PUBLICATIONS

Liew L-A et al; "Modeling of thermal actuation in a bulk-micromachined CMOS micromirror"; Microelectronics Journal, Mackintosh Publications Ltd. Luton, GB, vol. 31, No. 9-10, Oct. 1, 2000, pp. 791-801.

Khechana F et al: "Thermally actuated micro scanner for barcode reader applications"; Optical MEMS and Their Applications Conference, 2005. IEEE/LEOS International Conference on Oulu, Finland Aug. 1-4, 2005, Piscataway, NJ, USA, IEEE, Aug. 1, 2005, pp. 57-58.

Buhler J et al; "Thermally actuated CMOS micromirrors"; Sensors and Actuators A, Elsevier Sequoia S.A., Lausanne, CH, vol. 47, No. 1-3, Mar. 4, 1995, pp. 572-575.

International Search Report Dated Mar. 13, 2009 for International Application No. PCT/EP2008/058018.

* cited by examiner

Fig 12

THERMALLY ACTIVATED MICROMIRROR AND FABRICATION METHOD

CROSS REFERENCE TO RELATED APPLICATIONS

This application is the national stage application under 35 U.S.C. §371 of the International Application No. PCT/EP2008/058018, and claims the benefit of Int'l Application No. PCT/EP2008/058017, filed Jun. 24, 2008, the entire disclosure of which is incorporated herein by reference in its entirety.

FIELD OF THE INVENTION

The present invention relates to a method for fabricating micromirrors. The present invention also relates to a new thermally activated micromirror structure.

BACKGROUND OF THE INVENTION

Micromirrors formed in semiconductor wafers are used in many devices, such as, for example, medical imaging devices, optical spectrometers and also in barcode readers.

Herein we will consider micromirrors formed from portions of a monocrystalline semiconductor substrate, usually in silicon, fixed to the substrate and capable of being orientated with respect to the substrate by means of thermally deformable arms.

Figure 1:
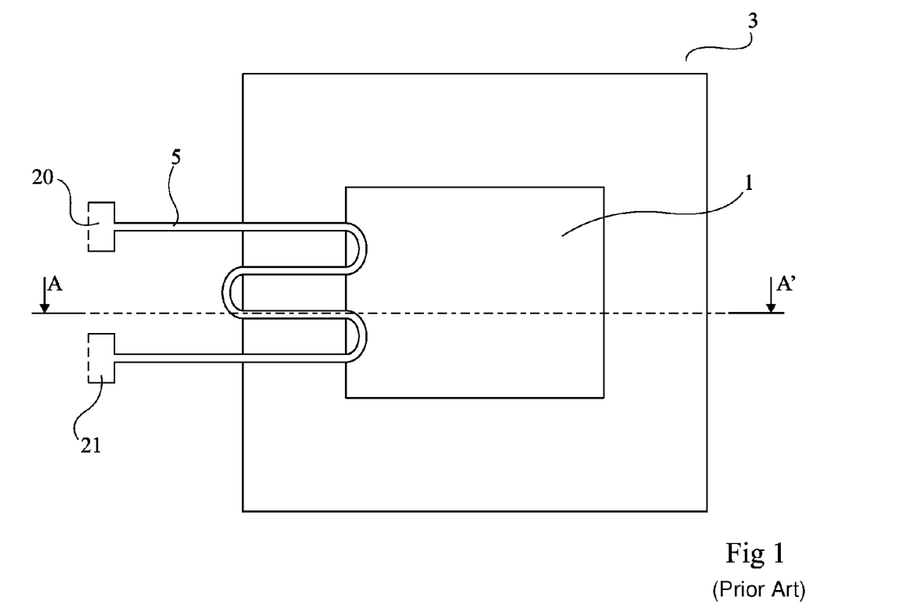
FIGS. 1 and 2, described above, illustrate an example of a known micromirror.
Figure 2:
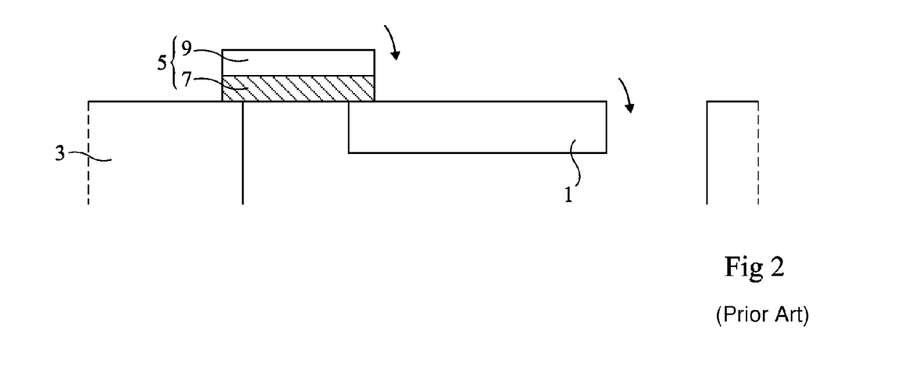

FIGS. 1 and 2 illustrate, in plan view and in cross-section taken in the plane A-A', a micromirror 1 as described in the article "Thermally actuated micro scanner for bar code reader application", by F. Khechana, H. Van Lintel, J.-L. Massieu, S. Ackley and P. Renaud, published in Optical MEMS conference 2005.

Micromirror 1 is fixed to a silicon wafer 3 by thermally deformable arms 5. Arms 5 extend, in plan view, in a comb shape between wafer 3 and the micromirror 1. The arms 5 are formed of a portion of continuous conductive track 9, which extends between conductive contacts 20 and 21 deposited on the wafer 3. The conductive track 9 rests on an underlying insulating layer 7. For example, the separation between the wafer 3 and the micromirror 1 is between 20 and 40 µm, and the thickness of micromirror 1 is between 20 and 100 µm. Micromirror 1 has the shape of a square having sides of one millimetre in length. While a voltage is applied between the two contacts 20 and 21, the conductive line 9 heats up, and the arms 5 deform by a bimorph effect which causes the micromirror 1 to move as illustrated by the arrows in FIG. 2. The arms 5 are pulled down more when the applied voltage is higher. By regulating the applied voltage, it is thus possible to modify the orientation of the mirror 1. The materials of layers 7 and 9 are also chosen to provide a desired amplitude of displacement of mirror 1. The insulating layer 7 is for example formed of silicon oxide and the conductive line 9 of aluminum.

FIGS. 3A to 3E are partial and schematic cross-section views taken in the plane A-A' of FIG. 1 and illustrating successive steps in a method of fabricating the micromirror of FIGS. 1 and 2.

Figure 3A:
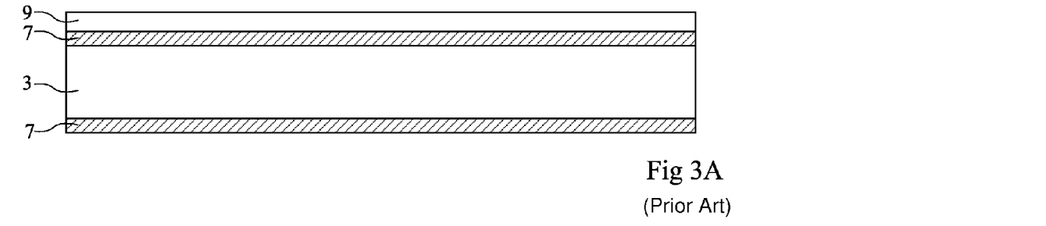
FIGS. 3A to 3E are cross-section views according to the plane A-A' of FIG. 1 illustrating successive steps in a known method for forming the micromirrors of FIGS. 1 and 2.

As illustrated in FIG. 3A, we start with a monocrystalline silicon wafer 3 having a thickness in the order of 300 to 400 µm. A layer 7 of silicon oxide is formed on the two sides of the wafer 3. The layer 7 has a thickness of around 1 µm.

An aluminum layer 9 is deposited on the front and back faces of wafer 3. The layer 9 has a thickness of around 1 µm.

Figure 3B:
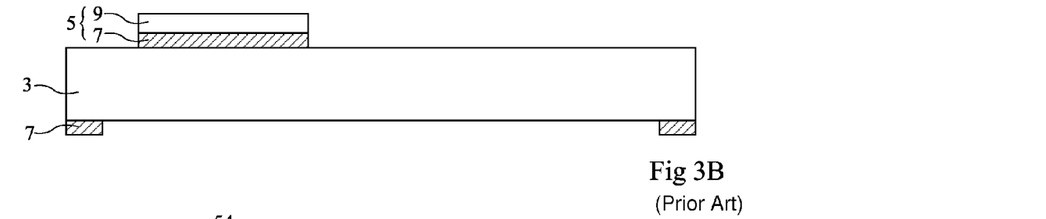
Figure 4:
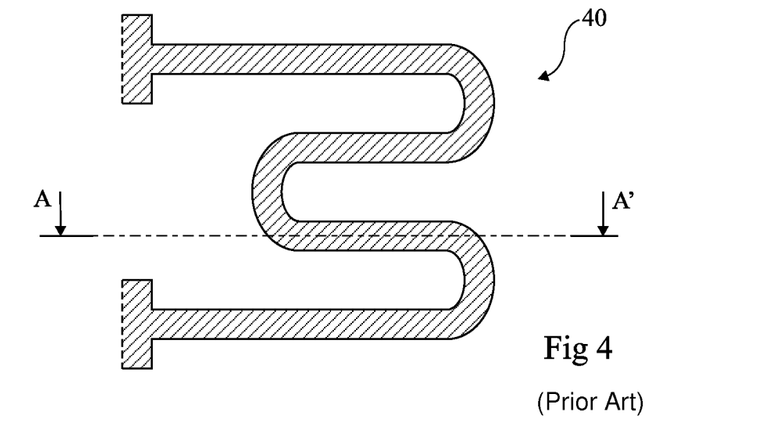
FIGS. 4 and 5 illustrate, in plan view, masks used during steps described in relation to FIGS. 3B and 3C-F.

In the next steps, the result of which is illustrated in FIG. 3B, on the front face, the stack of layers 9 and 7 is partially removed so as to expose the wafer 3. The partial removal is performed by means of a mask 40 illustrated in plan view in FIG. 4. The plane A-A' of the cross-section of FIG. 3B is shown in FIG. 4. The removal is performed such that only the stacks 7-9 providing the shape of the arms 5 in FIGS. 1 and 2 remain. The arms 5 have a width of between 5 and 40 µm, preferably around 30 µm. The contacts 20 and 21 can have sides of 100 µm or more in length. Two arms are separated by a gap having the same order of magnitude as the width of the arms. As illustrated in FIG. 3B, on the back face, layer 7 is removed such that a central part of the wafer 3 is exposed.

Figure 3C:
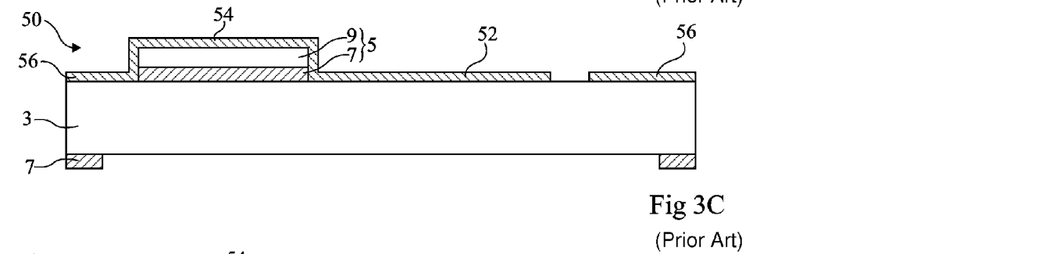
Figure 5:
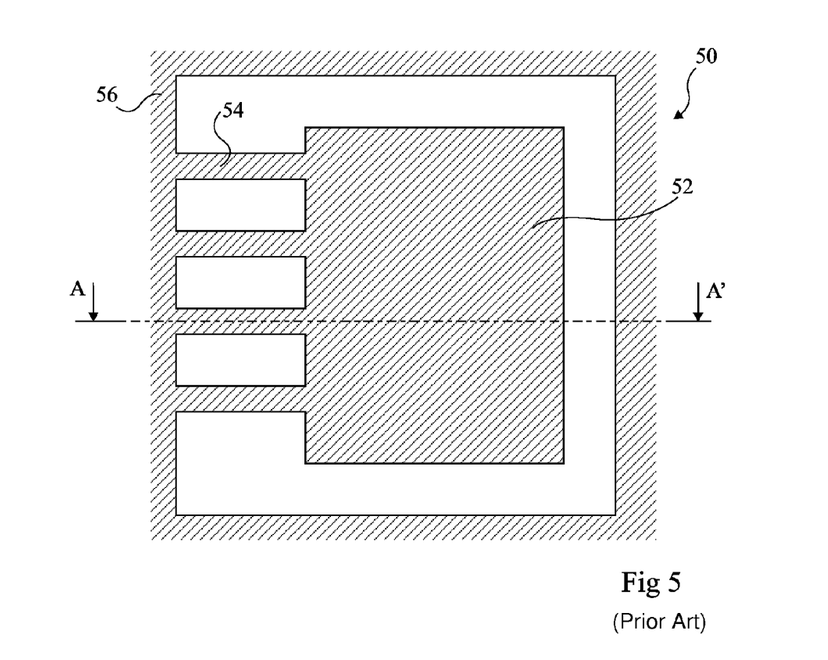

Next, as illustrated in FIG. 3C, a mask 50 is deposited on the front face. FIG. 5 illustrates in plan view the mask 50. The plane A-A' of the cross-section of FIG. 3C is shown in FIG. 5. The mask 50 corresponds to the striped region in FIG. 5. It comprises a central square 52 linked by arms 54 to a frame 56. The central square corresponds to micromirror 1 and the arms 54 to the arms 5 formed previously.

Figure 3D:
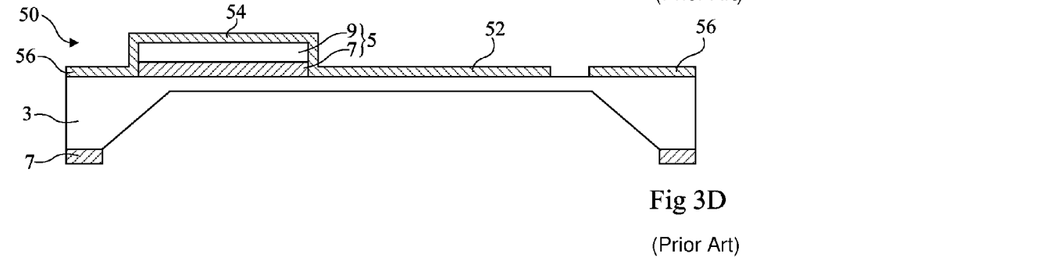

As illustrated in FIG. 3D, etching is then performed on the back face, of the silicon forming the wafer 3. The etch is a wet etch performed with the help of potash (KOH). Etching occurs on back face everywhere where the back face is not protected by the mask provided by insulating layer 7. The etch is continued until, with regard to the opening of layer 7, only a thin layer of wafer 3 remains, in the order of 30 to 40 µm, on the front face of wafer 3. This thin layer corresponds more or less to the desired thickness of the micromirror.

Figure 3E:
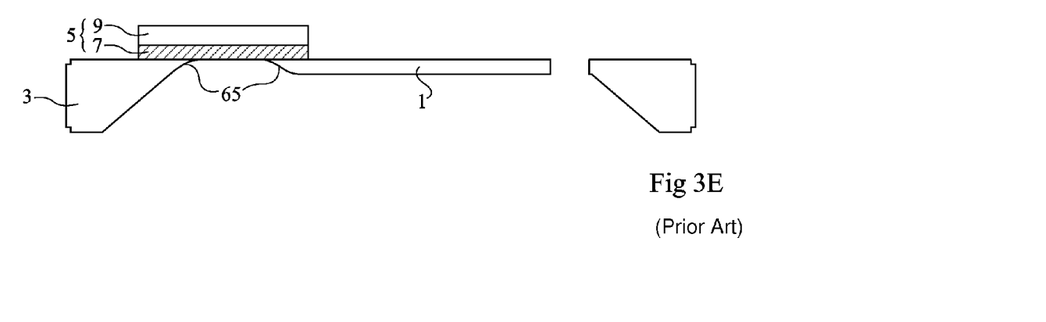

As illustrated in FIG. 3E, we then proceed with an isotropic etch from the front face. The surfaces of wafer 3 not protected by the mask 50 are etched. The micromirror 1 is thus delimited and only remains linked to the rest of the wafer 3 by arms 5. While not visible in the cross-sections, it should be noted that, during these steps, the regions between the arms 5 are removed by etching. Simultaneously, the thin portions of the silicon wafer under the arms 5 are etched, laterally, and are totally removed while the thin portion of wafer which corresponds to the micromirror 1 is only lightly etched on its large sides. The etch is for example a dry etch performed by means of a plasma containing sulfur hexafluoride ($SF_6$).

Figure 6A:
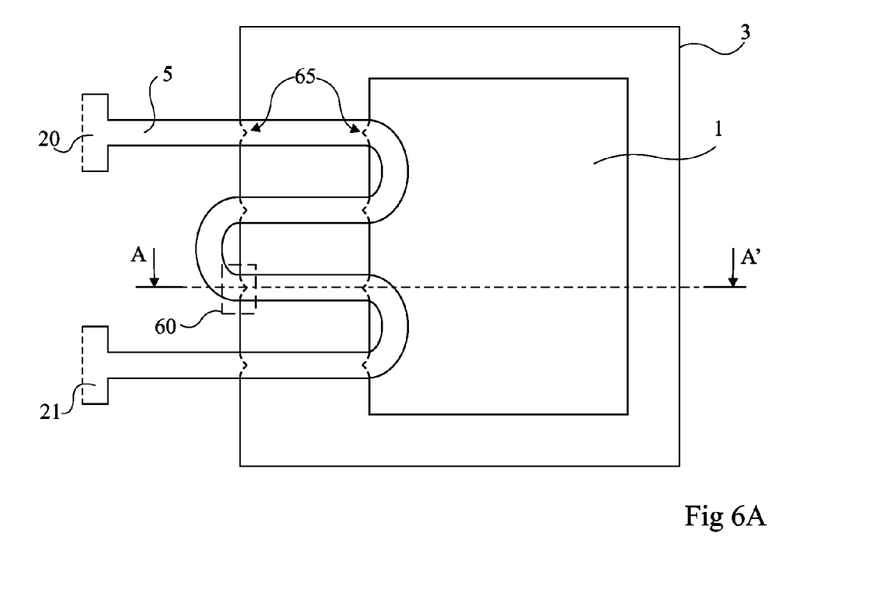
FIG. 6A illustrates, in plan view, the structure of FIG. 3E.
Figure 6B:
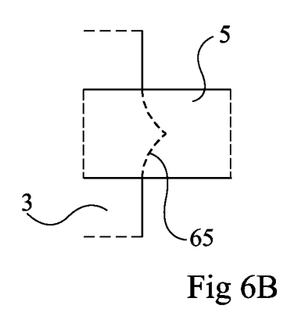
FIG. 6B is an enlargement of a portion of FIG. 6A.

FIG. 6A illustrates the same structure in plan view. The plane A-A' of FIG. 6A is the axis of the cross-section of FIG. 3E. FIG. 6B is an enlarged view of a portion of FIG. 6A at the level of frame 60, in other words at the level of the edge between wafer 3 and the region separating wafer 3 from the micromirror. The elements drawn by dashed line in FIGS. 6A and 6B will be described below.

The micromirrors obtained according to the above known method present problems. In particular, it has been found that after a certain number of uses or following shock, cracks in the arms result.

A further problem with these micromirrors is the appearance of errors in the orientation of the mirror during the lifetime of the device.

A further problem with these micromirrors is the appearance of defects in the form of cracks in the arms at their fulcrums on the side of the mirror and on the side of the wafer.

A further problem with these micromirrors is the fact that the previous problems are not detectable during test phases but appear during use of the device containing the micromirrors, causing breakdown of the device and imposing particularly difficult maintenance operations on the user.

SUMMARY OF THE INVENTION

The present invention aims at a method of fabricating micromirrors that do not present the problems of the micromirrors obtained by known methods.

According to one aspect of the present invention, there is provided a method of fabricating, in a monocrystalline silicon wafer, a micromirror linked by at least two thermally deformable arms, comprising the following steps:

depositing and etching, on the front face of the wafer, layers forming the arms;

etching the wafer in a region of the back face such that only a thin portion of the wafer remains in the region of formation of the micromirror and the arms;

performing an anisotropic etch to delimit the micromirror and the wafer, such that the thin portion of the wafer remains only in the areas of the micromirror and the arms; and performing an isotropic etch to remove the thin portion of the wafer under the arms; the etching step for forming the arms being performed following the shape of the arms and so as to form holes traversing the arms, the holes having a diameter less than the width of the arms and being positioned at edges of the region separating the micromirror and the wafer on both the side of the micromirror and the side of the portions of the wafer remaining after the anisotropic etching step.

According to an embodiment of the present invention, before the step of forming the arms, before the anisotropic etching step or before the isotropic etching step, parallel metallic lines are formed in the area of the formation of the micromirror, outside the region for fixing the arms.

According to another embodiment of the present invention, the metallic lines are formed by pulverization or vaporization of at least an insulating and/or metallic material using a hard mask.

According to another embodiment of the present invention, the anisotropic etching is a dry etch performed by means of a plasma comprising octafluorobutene and sulfur hexafluoride.

According to another embodiment of the present invention, the isotropic etch is a dry etch preformed using a plasma comprising sulfur hexafluoride.

According to an aspect of the present invention, there is provided a micromirror linked by at least two thermally deformable arms to a monocrystalline silicon wafer, each arm having traversing holes at locations at the edges of the region separating the micromirror and the wafer on both the side of the micromirror and the side of the wafer, the traversing holes having a diameter less than the width of the arms.

According to an embodiment of the present invention, each arm comprises an insulating layer and an overlying conductive layer.

According to another embodiment of the present invention, each arm has a width of between 10 and 100 µm and the holes have a diameter of between 2 and 50 µm.

According to an embodiment of the present invention, the micromirror comprises a network of parallel lines.

According to another aspect of the present invention, there is provided a bar code reader having at least one micromirror according to any of the preceding embodiments.

According to another aspect of the present invention, there is provided a spectrometer comprising at least one micromirror according to any of the preceding embodiments.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

DETAILED DESCRIPTION OF THE INVENTION

For clarity, as is generally the case in representation of microsystems, the various figures are not drawn to scale.

The present invention is based on studies performed by the inventors into the origins of defects observed during operation. In particular, the inventors have studied photographs of the structure obtained by the known method described above.

As illustrated by the dashed lines in FIG. 6A and the enlargement of FIG. 6B, after the isotropic etch of the silicon performed during the step described in relation to FIG. 3E, the inventors have found that a point of silicon 65 remains under each portion of arms 5 at the fulcrum of the arms, on the side of the micromirror as well as on the side of the wafer.

The inventors have determined that these points 65 are the origin of the problems observed during operation because they cause wearing and/or detachment of arms 5 and provoke defects in arms 5 both on the side of the micromirror 1 and on the side of the wafer 3.

It is believed by the inventors that the formation of points 65 is inherent in the isotropic etching process of the silicon under the arms 5.

Figure 7:
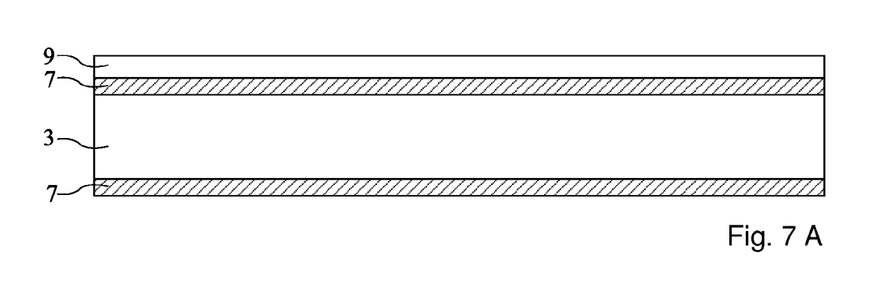
FIGS. 7A to 7F are cross-section views illustrating successive steps of a method of fabricating a micromirror according to an embodiment of the present invention.
Figure 7B:
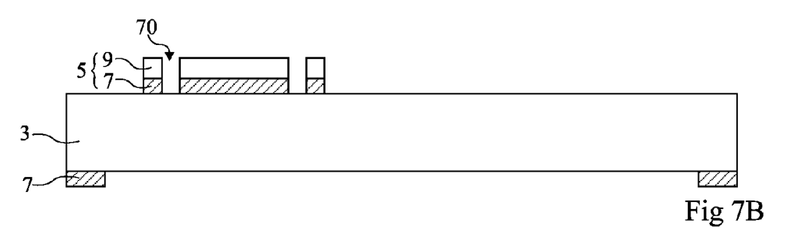
Figure 7C:
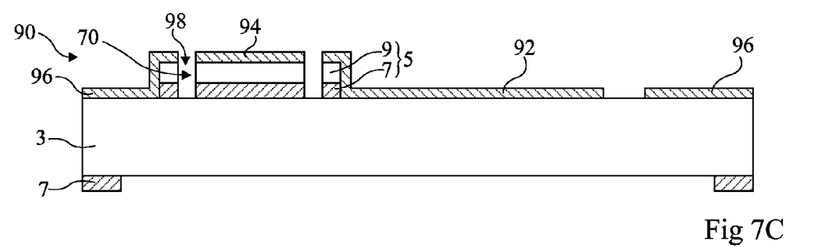
Figure 7D:
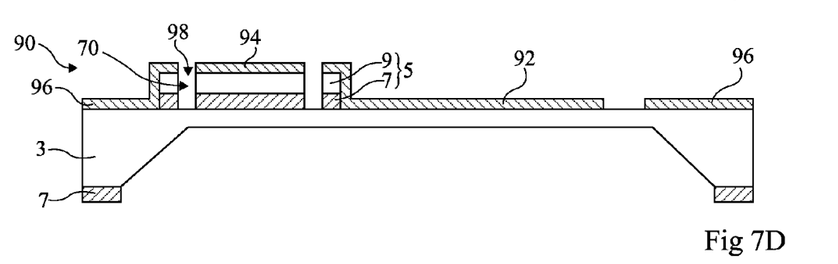
Figure 7E:
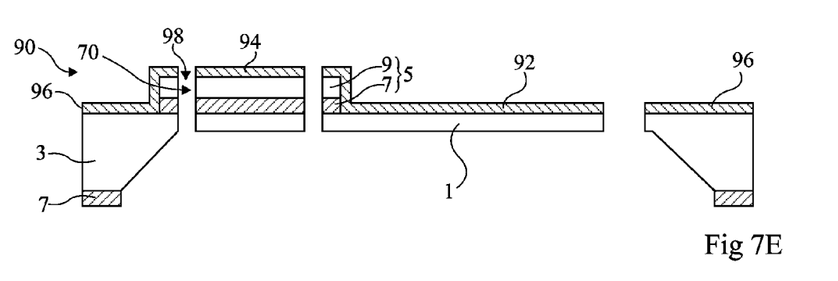
Figure 8:
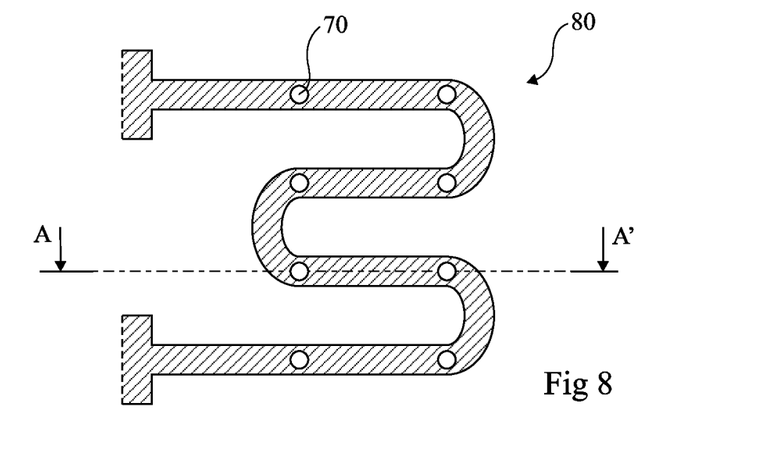
FIGS. 8 and 9 are plan views of masks used according to an embodiment of the present invention during the steps of FIGS. 7B and 7C-F.
Figure 9:
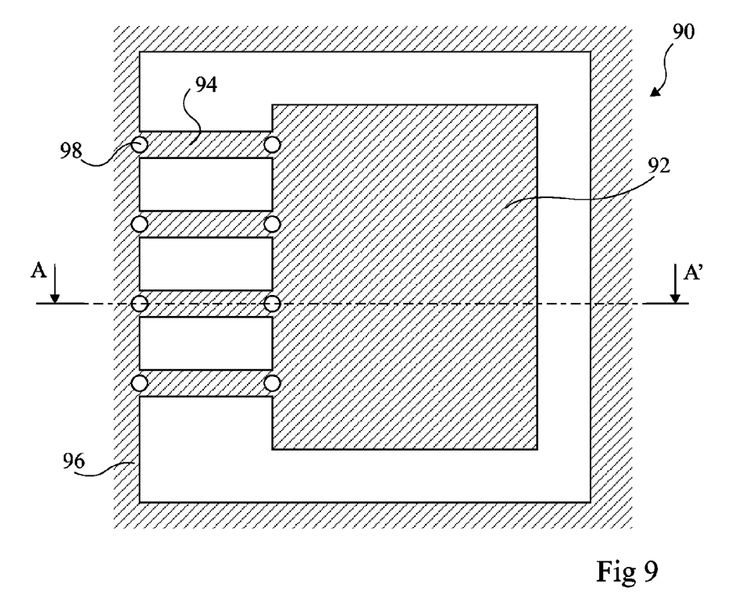
Figure 10A:
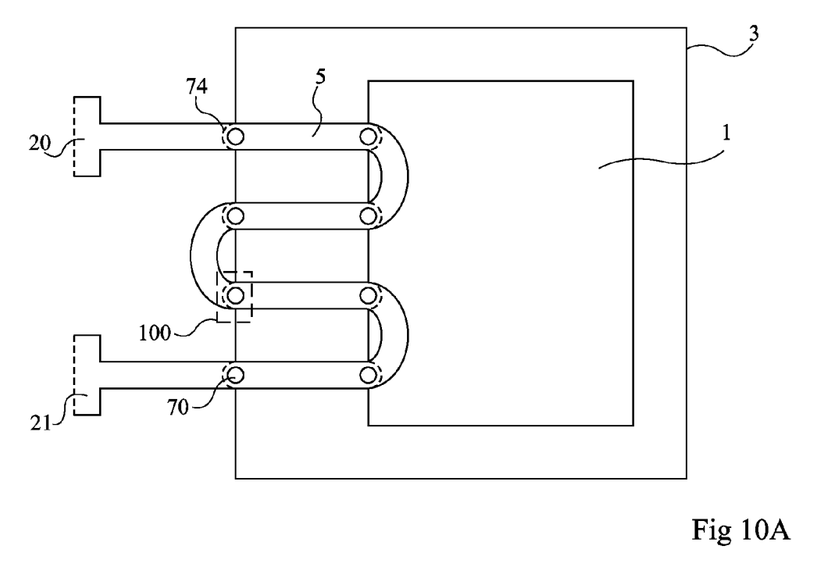
FIG. 10A is a plan view of the structure shown by the cross-section of FIG. 7F.
Figure 10B:
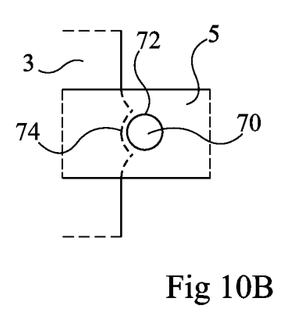
FIG. 10B is an enlargement of part of FIG. 10A.

To avoid the formation of points 65, an embodiment of the present invention provides the method described in relation to the cross-section views of FIG. 7A-E, the plan views of FIGS. 8 and 9 and the plan view of FIG. 10A, of which a part 100 is enlarged in FIG. 10B.

As illustrated in FIG. 7A, we start with a monocrystalline semiconductor wafer 3. Wafer 3 is for example a silicon wafer having a thickness of between 300 and 400 µm. The wafer 3 is covered on its back face by a layer 7 and on its front face by a stack of the layer 7 and a conductive layer 9. The layers 7 and 9 are made of materials suitable for forming a bimorph. The layer 7 is for example an insulating layer. The layer 7 is the result for example of a thermal oxidation of the surfaces of wafer 3. The layer 7 can equally result from the deposition of a silicon oxide ($SiO_2$) layer or an alternative insulator such as silicon nitride ($Si_3N_4$). Alternatively, layer 7 can have a multilayer structure comprising several insulating materials such as silicon oxide ($SiO_2$) or silicon nitride ($Si_3N_4$). Layer 7 has a thickness in the order of 1 to 3 µm, for example 1 µm. The conductor 9 is a material of low resistance, preferably metallic, suitable for forming a bimorph actuator with the underlying insulating layer 7. The layer 9 is for example a layer of aluminum having a thickness of between 1 and 3 µm, for example around 1 µm.

In the next steps illustrated in FIG. 7B, on the front face, the stack of the conductor 9 and insulator 7 is etched such that only a shape 80, shown in plan view in FIG. 8, remains. The shape 80 is the desired shape of the arms 5. The arms 5 have holes 70, which completely traverse the stack of layers 7 and 9. The top surface of wafer 3 is visible at the end of the holes 70. The holes 70 have a diameter less than the width of the arms 5. The diameter of the holes 70 is chosen such that the resistance of the arms 5 is not compromised. For example, for arms 5 having a width of between 10 and 100 µm, preferably around 20 µm, the diameter of the holes 70 is in order of 2 to 50 µm, preferably 6 µm. The holes 70 are formed at places that correspond, on both the side of micromirror 1 and also the side of the wafer 3, to the edges of a region formed later in the process, which separates the wafer 3 from the micromirror 1.

Next, as illustrated in FIG. 7C, a mask 90 illustrated in plan view in FIG. 9 is deposited on the front side. Mask 90 corresponds to the striped regions in FIG. 9. Mask 90 includes a central square 92 linked by arms 94 to a frame 96. The central square 92 corresponds to the micromirror 1 and the arms 94 to the arms 5 formed previously. Mask 90 further has holes 98 at points between the arms 94 and, on one side, the central portion 92, and on the other side, the frame 96. The holes 98 are aligned with the holes 70.

As illustrated in FIG. 7D, an etch is then performed, for example a wet etch using potash, such that the wafer 3 is deep etched from the back face such that only a thin portion of silicon having a thickness of between 30 and 40 µm, for example 40 µm, remains on the front face.

As illustrated in FIG. 7E, an anisotropic silicon etch is then performed, for example, a dry etch performed by means of a plasma containing sulfur hexafluoride ($SF_6$) and octafluorobutene ($C_4F_8$). On the front face, the silicon is etched according to the shape of mask 90. The etch thus extends to the region separating the central square 92 from the frame 96 and in the regions separating the arms 5 and the holes 98. The silicon is thus etched around the micromirror 1 and in the holes 70 traversing the arms 5. The holes 70 are thus extended in the silicon to traverse the wafer 3. The holes 70 traverse the silicon at the edges of the region separating the wafer 3 and the micromirror 1. The regions separating two adjacent arms are formed during this step. Between the wafer 1 and the micromirror 1 only the portions of silicon adjacent and underlying the arms 5 and the portions penetrated by holes 70 remain.

Figure 7F:
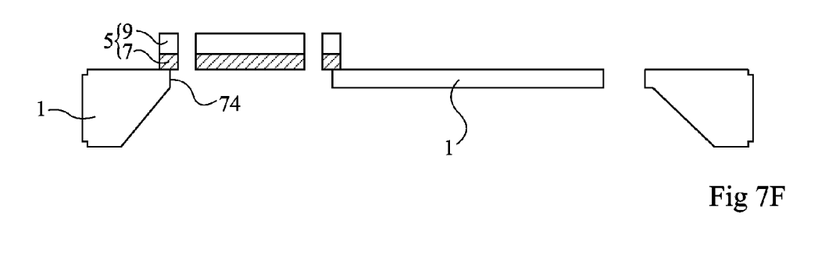

An isotropic etch is then performed, the result of which, after etching mask 90 on the front face and layer 7 on the back face, is represented in cross-section view in FIG. 7F and in plan view in FIG. 10A, of which a portion 100 is enlarged in FIG. 10B. The etch is for example a dry etch performed by means of a plasma comprising sulfur hexafluoride ($SF_6$). The etch extends under the arms 5 simultaneously laterally from each side, from below and from the edges 72 of holes 70. At holes 70, the etch thus follows the perimeter 72 and confers a rounded contour 74 to the silicon at the level of the fulcrums of arms 5 at the edge of wafer 3 and at the edge of the micromirror.

The extension of the etch to the thin portion of the wafer 3 via the holes 70 allows the known formation of points 65 of FIGS. 3E, 6A and 6B to be avoided.

The removal of points 65 allows problems observed in the known structures to be avoided.

Figure 11:
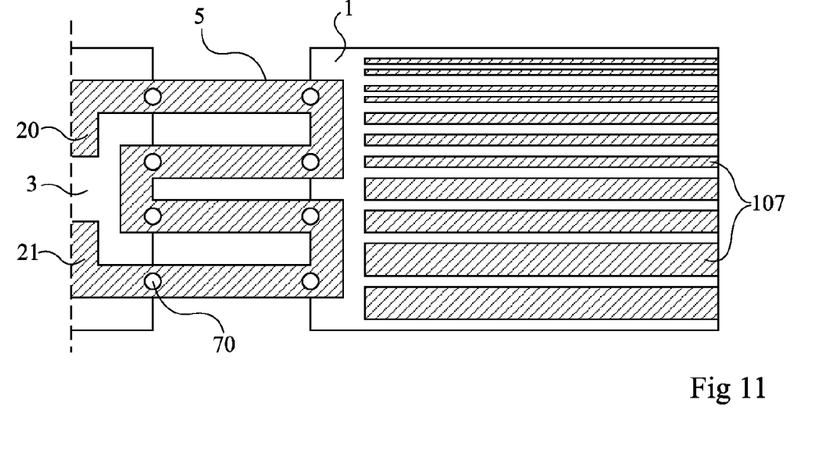
FIG. 11 is a plan view of a further embodiment of the present invention.

According to a further embodiment of the invention illustrated in plan view in FIG. 11, a network 107 of parallel lines is formed on the top surface of micromirror 1. The network 107 is formed outside the region in which the arms 5 are fixed. The parallel lines of network 107 are of a number, a width and a spacing chosen to form a diffraction grating adapted for diffracting a light beam received by the micromirror to a beam having one or a number of predetermined wavelengths. The network 107 can be formed on the micromirror 1 such that the wavelength of the light beam reflected by the micromirror depends on the orientation provided by arms 5.

According to an embodiment of the invention, the network 107 results from a modification of mask 90 such that the network is formed at the same time as arms 5. The parallel lines forming the network thus comprise the stack of the layers 9 and 7.

According to a further embodiment of the invention, the network 107 is formed separately from the formation of arms 5. The network 107 results thus from a specific sequence of deposition of a metallic or an insulating material.

According to a further embodiment, the network 107 is deposited by means of a shadow mask method wherein at least one material is sprayed or vaporized through holes of a hard mask deposited on the structure.

The parallel lines of the network 107 are for example made of a metal such as gold. Alternatively, they are made of an insulator such as silicon oxide.

According to an embodiment, the sequence for forming network 107 is implemented before the formation of arms 5, in other words before depositing and etching the layers 7 and 9.

According to a further embodiment, the network 107 is formed after the formation of arms 5, but before depositing mask 90.

Figure 12:
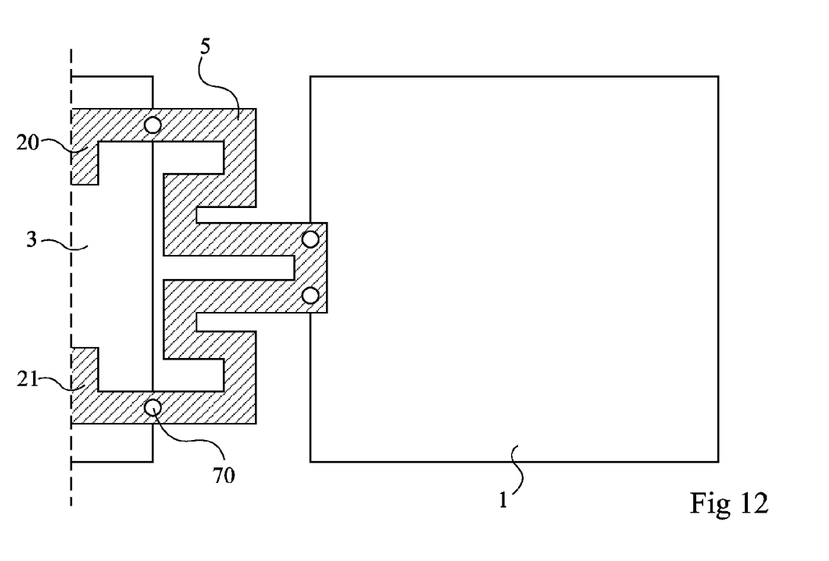
FIG. 12 is a plan view of a further embodiment of the present invention.

A number of particular embodiments of the present invention have been described. Various alternatives and modifications will appear to those skilled in the art. Furthermore, those skilled in the art will understand that the shape of different parts, in particular the arms and the micromirror, are not limited to the shapes represented. Furthermore, in FIGS. 1 to 11, it is considered that the isolated line 7-9 that forms arms 5 has alternate fulcrums on the micromirror 1 and the wafer 3. However, as illustrated in the plan view of FIG. 12, the line 7-9 can present more alternations in the interval separating the micromirror 1 and the wafer 3 than fulcrums on the micromirror and/or on the wafer. Each fulcrum of the arms 5 on the micromirror 1 or the wafer 3 is associated with a traversing hole 70.

Those skilled in the art will also understand that the hereabove described materials can be modified. The conductive line 9 can thus be made of any metal different from aluminum as far as it is suitable for being deposited by PVD, such as copper, tungsten, molybdenum, or other metals. The layer 7 is described as an insulating layer such as silicon oxide, silicon nitride or a multi-layer structure comprising multiple insulating layers. However, layer 7 can be any insulating or conductive layer or a multi-layer structure comprising multiple insulating and/or conductive layers as long as layer 7 forms a bimorph together with layer 9.

Similarly, when formed independently from arms 5, the network 107 is described as being made of parallel lines of a metal or an insulator. However, the lines can comprise a multi-layer structure comprising several conductive or insulating layers. The multi-layer structure can also comprise conductive and insulating layers.

Such alterations, modifications and improvements are intended to be within the spirit and scope of the invention. Accordingly, the foregoing description is by way of example only and is not intended to be limiting. The invention is limited only as defined in the following claims and the equivalent thereto.

The invention claimed is:

1. A method for fabricating, in a monocrystalline silicon wafer, a micromirror linked by at least two thermally deformable arms, comprising the steps of:
   depositing and etching, on the front face of the wafer, layers forming the arms;
   etching the wafer in a region of the back face such that only a thin portion of the wafer remains in the region of formation of the micromirror and the arms;
   performing an anisotropic etch to delimit the micromirror and the wafer, such that the thin portion of the wafer remains only in the areas of the micromirror and the arms; and
   performing an isotropic etch to remove the thin portion of the wafer under the arms;
   wherein the etching step for forming the arms is performed following the shape of the arms and forms a plurality of holes traversing the arms, the plurality of holes having a diameter less than the width of the arms and being positioned at edges of the region separating the micromirror and the wafer on the side of the micromirror and on the side of the portions of the wafer remaining after the anisotropic etching step; and wherein, before the step of forming the arms, before the anisotropic etching step or before the isotropic etching step, a plurality of parallel metallic lines are formed in the area of the formation of the micromirror, outside the region for fixing the arms.

2. The method according to claim 1, wherein the metallic lines are formed by pulverization or vaporization of at least one of an insulating and a metallic material using a hard mask.

3. The method according to claim 1, wherein the anisotropic etching is a dry etch performed by a plasma comprising octafluorobutene and sulfur hexafluoride.

4. The method according to claim 1, wherein the isotropic etch is a dry etch performed using a plasma comprising sulfur hexafluoride.

5. A micromirror linked by at least two thermally deformable arms to a monocrystalline silicon wafer, each arm having a plurality of traversing holes at locations at the edges of the region separating the micromirror and the wafer on the side of the micromirror and on the side of the wafer, the traversing holes having a diameter less than the width of the arms, and wherein the micromirror has, disposed on a surface of the micromirror, a plurality of metallic lines.

6. The micromirror of claim 5, wherein each arm comprises an insulating layer and an overlying conductive layer.

7. The micromirror according to claim 5, wherein each arm has a width of between 10 and 100 µm and the holes have a diameter of between 2 and 50 µm.

8. The micromirror according to claim 5, wherein the plurality of metallic lines on the surface of the micromirror are parallel.

9. A bar code reader comprising at least one micromirror, said micromirror being linked by at least two thermally deformable arms to a monocrystalline silicon wafer, each arm having a plurality of traversing holes at locations at the edges of the region separating the micromirror and the wafer on the side of the micromirror and on the side of the wafer, the traversing holes having a diameter less than the width of the arms, and wherein the micromirror has, disposed on a surface of the micromirror, a plurality of metallic lines.

10. A spectrometer comprising at least one micromirror, said micromirror being linked by at least two thermally deformable arms to a monocrystalline silicon wafer, each arm having a plurality of traversing holes at locations at the edges of the region separating the micromirror and the wafer on the side of the micromirror and on the side of the wafer, the traversing holes having a diameter less than the width of the arms, and wherein the micromirror has, disposed on a surface of the micromirror, a plurality of metallic lines.

* * * * *